(12) United States Patent
Kwon et al.

(10) Patent No.: US 11,387,127 B2
(45) Date of Patent: Jul. 12, 2022

(54) SUBSTRATE TREATING APPARATUS AND SUBSTRATE TRANSFER APPARATUS

(71) Applicant: SEMES CO., LTD., Cheonan-si (KR)

(72) Inventors: Ohyeol Kwon, Cheonan-si (KR); Jung Hwan Lee, Pyeongtaek-si (KR); Soo Young Park, Incheon (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/930,660

(22) Filed: Jul. 16, 2020

(65) Prior Publication Data
US 2021/0020485 A1    Jan. 21, 2021

(30) Foreign Application Priority Data
Jul. 17, 2019  (KR) .......................... 10-2019-0086540

(51) Int. Cl.
*H01L 21/677*  (2006.01)
*H01L 21/687*  (2006.01)

(52) U.S. Cl.
CPC .. *H01L 21/67742* (2013.01); *H01L 21/68728* (2013.01); *H01L 21/68764* (2013.01)

(58) Field of Classification Search
CPC ......... H01L 21/67733; H01L 21/68764; H01L 21/67766; H01L 21/67742; H01L 21/67754; H01L 21/68707; H01L 21/68771
See application file for complete search history.

(56) References Cited

U.S. PATENT DOCUMENTS 3,968,885 A * 7/1976 Hassan ................ B23Q 7/1431
                                                          414/591
6,235,634 B1 * 5/2001 White ............... H01L 21/67167
                                                          438/680
(Continued)

FOREIGN PATENT DOCUMENTS

JP           6208804 B2    10/2017
JP        2018-107206 A     7/2018
(Continued)

OTHER PUBLICATIONS

Korean Notice of Allowance dated Mar. 30, 2021 issued in corresponding Korean Patent Appln. No. 10-2019-0086540.
(Continued)

*Primary Examiner* — Kaitlin S Joerger
(74) *Attorney, Agent, or Firm* — Harness, Dickey & Pierce, P.L.C.

(57) ABSTRACT

A substrate treating apparatus includes a plurality of load ports on which carriers having substrates received therein are placed, a plurality of process chambers that perform processes on the substrates, and a transfer robot that transfers the substrates between the load ports and the process chambers. The transfer robot is movable along a transfer passage having a lengthwise direction formed along a first direction, the load ports and the process chambers are arranged along the first direction on one side and an opposite side of the transfer passage, and the transfer robot transfers the substrates between the carriers placed on the load ports and the process chambers.

20 Claims, 13 Drawing Sheets

(56) References Cited

U.S. PATENT DOCUMENTS

| | | | | |
|---|---|---|---|---|
| 7,743,728 | B2* | 6/2010 | Ishikawa | H01L 21/6715 118/503 |
| 8,509,937 | B2* | 8/2013 | Takuma | H01L 21/67745 700/112 |
| 8,911,193 | B2* | 12/2014 | Rice | H01L 21/67745 414/226.05 |
| 9,281,222 | B2* | 3/2016 | Weaver | H01L 21/67742 |
| 10,427,303 | B2* | 10/2019 | Weaver | H01L 21/67161 |
| 2001/0024611 | A1* | 9/2001 | Woodruff | H01L 21/67769 414/744.5 |
| 2005/0079043 | A1* | 4/2005 | Ogawa | B25J 18/04 414/744.2 |
| 2005/0118010 | A1* | 6/2005 | Ogawa | B25J 9/009 414/744.1 |
| 2006/0231127 | A1* | 10/2006 | Lee | H01L 21/67742 134/61 |
| 2007/0144439 | A1* | 6/2007 | Englhardt | H01L 21/67742 118/719 |
| 2008/0124206 | A1* | 5/2008 | Choi | H01L 21/67781 414/744.2 |
| 2008/0166208 | A1* | 7/2008 | Lester | H01L 21/67051 414/217 |
| 2008/0166210 | A1* | 7/2008 | Hudgens | H01L 21/67196 414/288 |
| 2010/0178136 | A1* | 7/2010 | Ago | B25J 9/1065 414/217 |
| 2010/0321648 | A1* | 12/2010 | Nakaharada | H01L 21/67748 355/27 |
| 2011/0150607 | A1* | 6/2011 | Hong | H01L 21/67742 414/222.01 |
| 2011/0153062 | A1* | 6/2011 | Hong | H01L 21/67745 700/218 |
| 2013/0202390 | A1* | 8/2013 | Yazawa | B25J 9/043 414/222.09 |
| 2013/0294870 | A1* | 11/2013 | Shimada | B25J 11/00 414/217 |
| 2014/0105716 | A1* | 4/2014 | Lee | H01L 21/67706 414/749.1 |
| 2014/0121831 | A1* | 5/2014 | Kim | B25J 11/0075 700/245 |
| 2014/0154033 | A1* | 6/2014 | Blank | B25J 11/0095 414/217 |
| 2014/0305248 | A1* | 10/2014 | Yazawa | B25J 21/00 74/490.05 |
| 2015/0340209 | A1* | 11/2015 | Koltonski | H01J 37/32642 156/345.31 |
| 2016/0351425 | A1* | 12/2016 | Kim | H01L 21/67259 |
| 2017/0092522 | A1* | 3/2017 | Lee | H01L 21/67173 |
| 2018/0158708 | A1* | 6/2018 | Kuo | B66C 1/62 |
| 2018/0240695 | A1* | 8/2018 | Hayashi | H01L 21/67706 |
| 2018/0308729 | A1* | 10/2018 | Choi | H01L 21/67778 |
| 2019/0122870 | A1* | 4/2019 | Ishizawa | H01L 21/68742 |
| 2020/0111693 | A1* | 4/2020 | Kiyama | H01L 21/67748 |
| 2020/0126823 | A1* | 4/2020 | Teramoto | H01L 21/67736 |
| 2020/0167946 | A1* | 5/2020 | Kwon | H01L 21/67288 |
| 2020/0384635 | A1* | 12/2020 | Muthukamatchi | B25J 9/0009 |
| 2020/0384636 | A1* | 12/2020 | Muthukamatchy | B25J 15/0052 |
| 2021/0020485 | A1* | 1/2021 | Kwon | H01L 21/67742 |
| 2021/0057253 | A1* | 2/2021 | Bae | H01L 21/67178 |
| 2021/0090918 | A1* | 3/2021 | Kuwahara | H01L 21/67778 |
| 2021/0098270 | A1* | 4/2021 | Uchida | H01L 21/67742 |
| 2021/0118719 | A1* | 4/2021 | Wilkas | H01L 21/67167 |
| 2021/0146554 | A1* | 5/2021 | Hudgens | H01L 21/67742 |

FOREIGN PATENT DOCUMENTS

| | | |
|---|---|---|
| KR | 10-0598917 B1 | 7/2006 |
| KR | 100781816 B1 | 12/2007 |
| KR | 20080069295 A | 7/2008 |
| KR | 20100022803 A | 3/2010 |
| KR | 20140070495 A | 6/2014 |
| KR | 20140144322 A | 12/2014 |
| KR | 20170002773 A | 1/2017 |
| KR | 20170137196 A | 12/2017 |

OTHER PUBLICATIONS

Korean Office Action dated Aug. 26, 2020 issued in corresponding Korean Appln. No. 10-2019-0086540.

* cited by examiner

SUBSTRATE TREATING APPARATUS AND SUBSTRATE TRANSFER APPARATUS

CROSS-REFERENCE TO RELATED APPLICATIONS

A claim for priority under 35 U.S.C. § 119 is made to Korean Patent Application No. 10-2019-0086540 filed on Jul. 17, 2019, in the Korean Intellectual Property Office, the entire contents of which are hereby incorporated by reference.

BACKGROUND

Embodiments of the inventive concept described herein relate to a substrate treating apparatus.

In general, in a semiconductor manufacturing process, an arrangement of fine patterns is formed by repeatedly performing various processes such as deposition of an insulating film and a metallic material, etching, photoresist coating, developing, ashing, and the like. Foreign matter not completely removed by the etching or ashing process remains on a substrate. A wet cleaning process using deionized water or chemical is used as a process for removal of the foreign matter.

A substrate cleaning apparatus supplies chemical or deionized water to a substrate through a nozzle above the substrate while rotating the substrate by a motor after clamping the substrate to a substrate chuck in a small chamber capable of treating a single substrate. The chemical or the deionized water is spread over the substrate by the rotating force of the substrate, and accordingly the foreign matter adhering to the substrate is removed.

Figure 1:
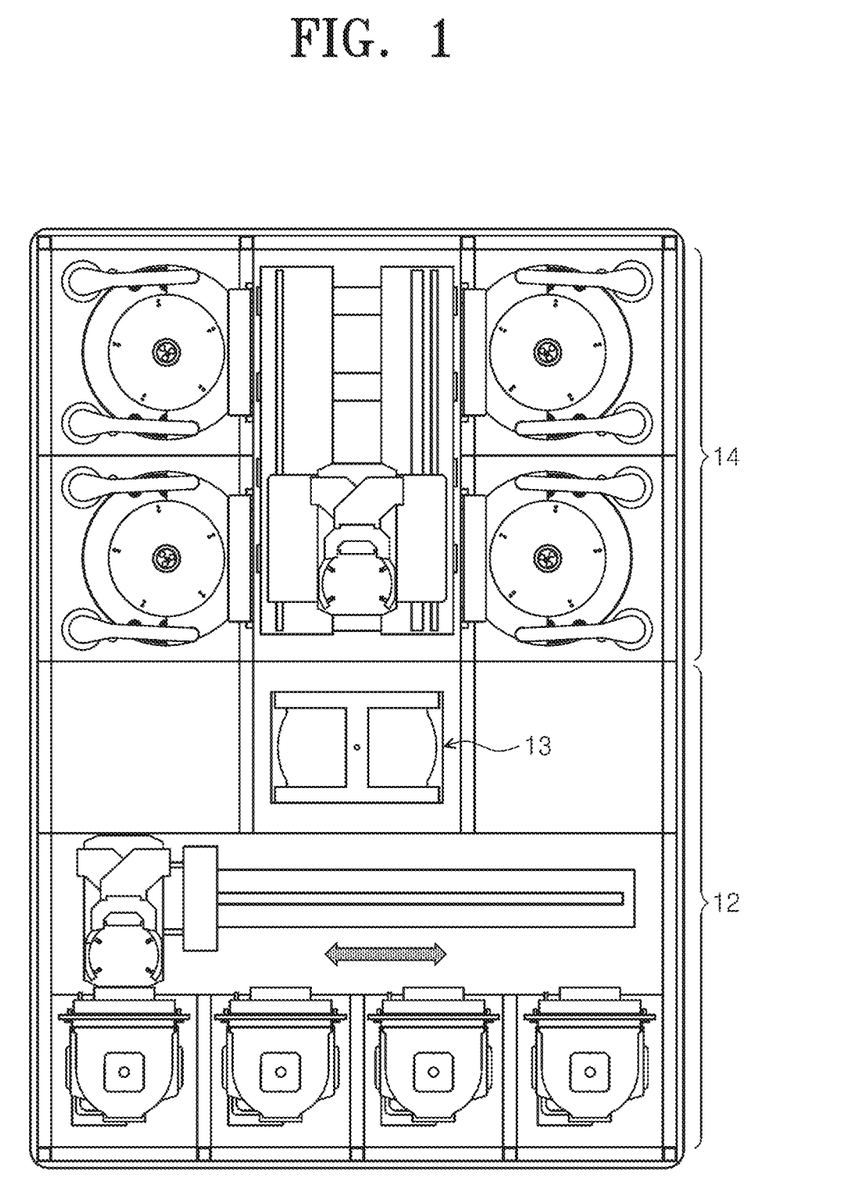
FIG. 1 is a view illustrating an arrangement structure of a substrate cleaning apparatus in the related art.

FIG. 1 is a view illustrating an arrangement structure of a substrate cleaning apparatus in the related art. The substrate cleaning apparatus includes an index module 12, a buffer unit 13, and a process module 14.

In the substrate cleaning apparatus, the process module 14 may include a total of 12 process chambers in a case where a maximum of four towers exist and each of the towers is constituted by three process chambers.

Furthermore, the substrate cleaning apparatus requires an index robot responsible for transferring a substrate in the index module 12 and a main transfer robot responsible for transferring the substrate in the process module 14. A buffer chamber that plays an intermediary role in the transfer of the substrate between the index robot and the main transfer robot is essential.

Because the substrate cleaning apparatus requires the two transfer robots and the buffer chamber as described above, spatial loss and a bottleneck phenomenon may occur.

SUMMARY

Embodiments of the inventive concept provide a substrate treating apparatus and a substrate transfer apparatus for increasing the number of process chambers that are installed in an existing equipment area.

Embodiments of the inventive concept provide a substrate treating apparatus and a substrate transfer apparatus for maximizing throughput of the apparatus.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a substrate treating apparatus includes a plurality of load ports on which carriers having substrates received therein are placed, a plurality of process chambers that perform processes on the substrates, and a transfer robot that transfers the substrates between the load ports and the process chambers. The transfer robot is movable along a transfer passage having a lengthwise direction formed along a first direction, the load ports and the process chambers are arranged along the first direction on one side and an opposite side of the transfer passage, and the transfer robot transfers the substrates between the carriers placed on the load ports and the process chambers.

A substrate entrance/exit opening of a first process chamber disposed on the one side of the transfer passage among the process chambers and a substrate entrance/exit opening of a second process chamber disposed on the opposite side of the transfer passage may be provided at different heights.

An upper end of a first process chamber disposed on the one side of the transfer passage among the process chambers and an upper end of a second process chamber disposed on the opposite side of the transfer passage may be provided at different heights.

The transfer robot may include a plurality of hands disposed at different heights, and the plurality of hands may simultaneously transfer the substrates into or out of the first process chamber and the second process chamber.

The plurality of hands may be rotatable to face one direction so as to simultaneously transfer the substrates into or out of one process chamber or a carrier placed on one load port.

A height difference between the substrate entrance/exit opening of the first process chamber and the substrate entrance/exit opening of the second process chamber or a height difference between the upper end of the first process chamber and the upper end of the second process chamber may correspond to a height difference between adjacent hands among the plurality of hands.

The load ports may be disposed to face each other, with the transfer passage therebetween.

Each of the load ports may include a vertical frame having a port door that opens or closes a door of a carrier, a mounting table on which the carrier is seated and that is movable to a position in which the door of the carrier is opened or closed by the port door, and a moving member that moves the carrier to the mounting table from a first position in which the carrier is transferred from a carrier transfer device.

The moving member may include a moving table capable of rotating and sliding such that the door of the carrier faces toward the port door of the load port.

The moving table may be located under a path along which the carrier transfer device moves.

A transfer robot for transferring substrates between carriers placed on load ports and process chambers includes a first hand and a second hand disposed at different heights, in which the first hand transfers the substrates into or out of one of a first process chamber and a second process chamber disposed to be opposite to each other with respect to a transfer passage, and the second hand transfers the substrates into or out of the other process chamber at the same time as the first hand.

One of the first hand and the second hand may be rotatable such that the first hand and the second hand face one direction to simultaneously transfer the substrates into or out of one of the first process chamber and the second process chamber.

A height difference between the first hand and the second hand may correspond to a height difference between a substrate entrance/exit opening of the first process chamber and a substrate entrance/exit opening of the second process chamber.

Each of the first hand and the second hand may include a plurality of transfer hands.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

In this embodiment, a semiconductor wafer exemplifies a substrate. However, the substrate may be various types of substrates, such as a photomask, a flat display panel, and the like, in addition to the semiconductor wafer. Furthermore, in this embodiment, it will be exemplified that a substrate treating apparatus is an apparatus for performing a substrate cleaning process.

Figure 2:
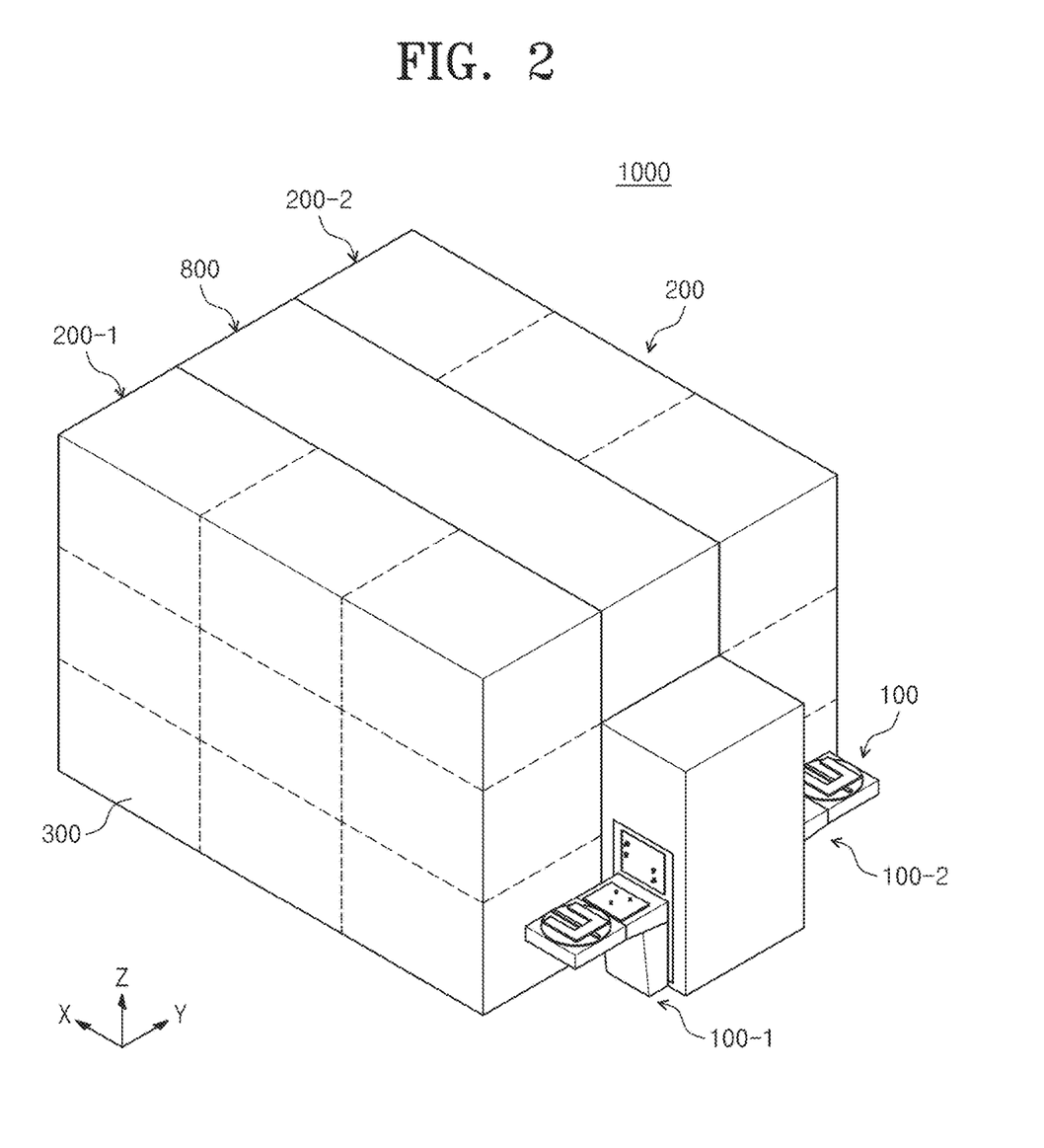
FIG. 2 is a perspective view illustrating a substrate treating apparatus according to an embodiment of the inventive concept.
Figure 3:
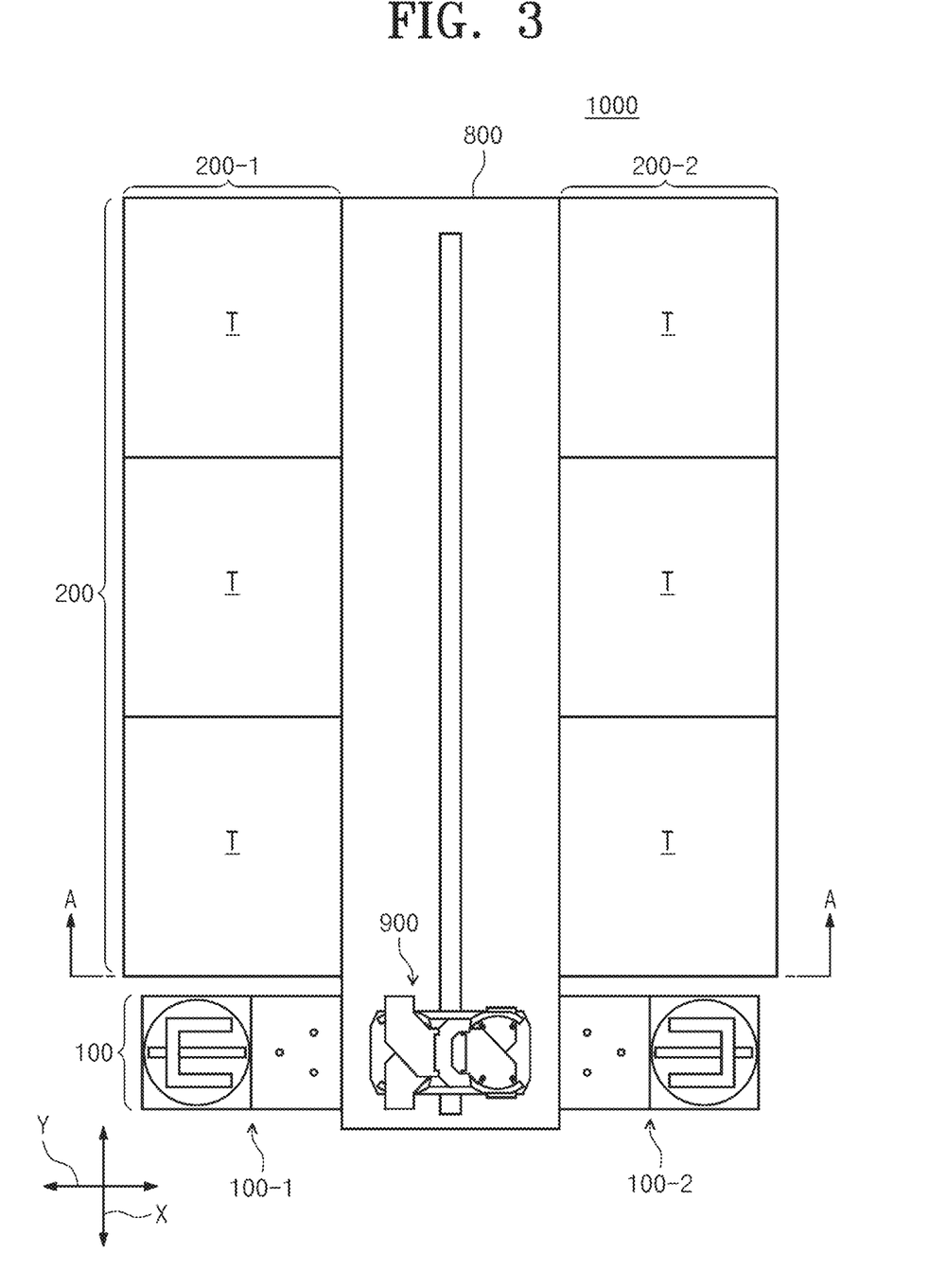
FIG. 3 is a plan view illustrating the substrate treating apparatus according to the embodiment of the inventive concept.
Figure 4:
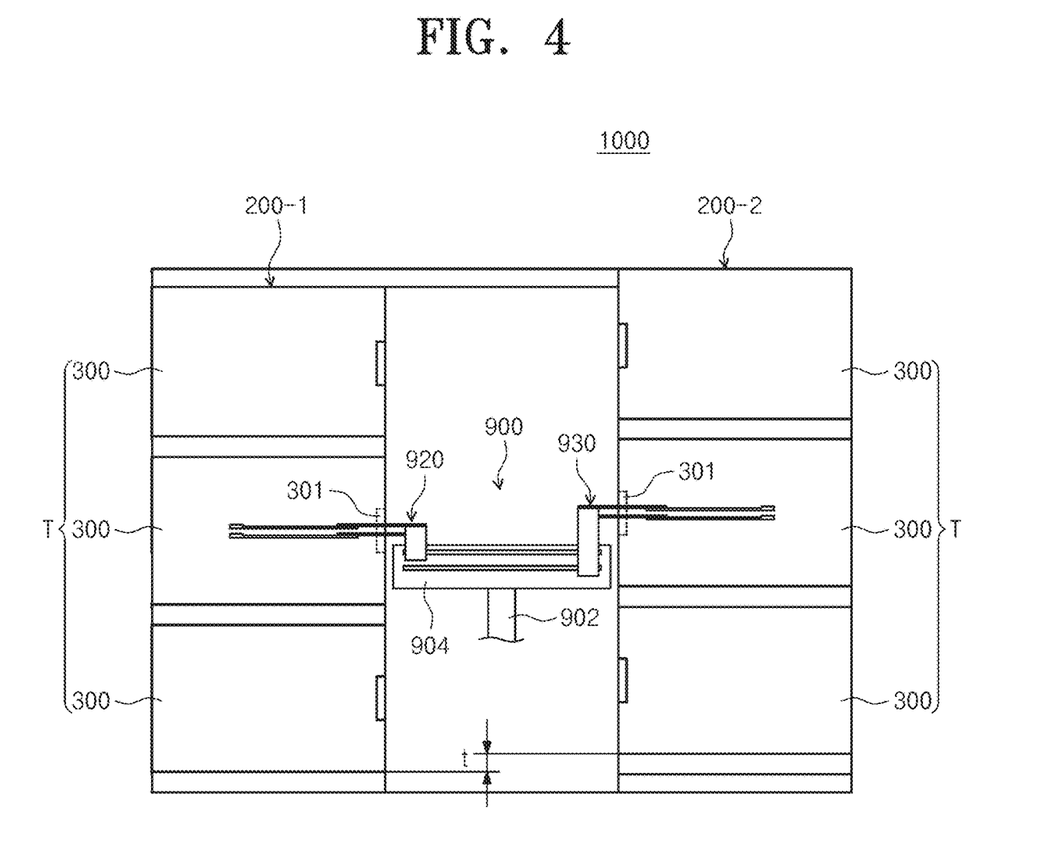
FIG. 4 is a sectional view of the apparatus of FIG. 3 when viewed from in direction A-A.

FIG. 2 is a perspective view illustrating a substrate treating apparatus according to an embodiment of the inventive concept. FIG. 3 is a plan view illustrating the substrate treating apparatus according to the embodiment of the inventive concept. FIG. 4 is a sectional view of the apparatus of FIG. 3 when viewed from in direction A-A.

Referring to FIGS. 2 to 4, a substrate treating apparatus 1000 of the inventive concept may include an index module 100, a process module 200, and a transfer robot 900.

The index module 100 and the process module 200 are sequentially disposed in a row. Hereinafter, a direction in which the index module 100 and the process module 200 are arranged is referred to as a first direction X. A direction perpendicular to the first direction X when viewed from above is referred to as a second direction Y, and a direction perpendicular to the plane including the first direction X and the second direction Y is referred to as a third direction Z.

The process module 200 may include a first process module 200-1, a second process module 200-2, and a transfer chamber 800. In the first process module 200-1 and the second process module 200-2, towers T, each of which has process chambers 300 stacked one above another in the third direction Z, are disposed along the lengthwise direction of the transfer chamber 800. That is, the process chambers 300 may be disposed in an A×B array (A and B being natural numbers of 1 or larger) on one side of the transfer chamber 800. Here, "A" is the number of process chambers 300 provided along the first direction X, and "B" is the number of process chambers 300 provided along the third direction Z. In a case where six or nine process chambers 300 are provided on the one side of the transfer chamber 800, the process chambers 300 may be disposed in a 2×3 or 3×3 array. The number of process chambers 300 may be increased or decreased.

In this embodiment, each of the towers T may have a structure in which three process chambers 300 are stacked one above another. Accordingly, the first process module 200-1 may include a total of nine process chambers 300 that the transfer robot 900 is able to access. Likewise to the first process module 200-1, the second process module 200-2 may include a total of nine process chambers 300 that the transfer robot 900 is able to access.

Substrate treating apparatuses for performing cleaning processes on substrates W are provided in the process chambers 300, respectively. The substrate treating apparatuses provided in the process chambers 300 may have different structures depending on the types of cleaning processes performed. Alternatively, the substrate treating apparatuses in the respective process chambers 300 may have the same structure. In another case, the process chambers 300 may be divided into a plurality of groups. The substrate treating apparatuses provided in the process chambers 300 belonging to the same group may have the same structure. The substrate treating apparatuses provided in the process chambers 300 belonging to different groups may have different structures.

For example, in a case where the process chambers 300 are divided into two groups, a first group of process chambers 300 may be provided in the first process module 200-1 located on the one side of the transfer chamber 800, and a second group of process chambers 300 may be provided in the second process module 200-2 located on an opposite side of the transfer chamber 800. Selectively, on the one side and the opposite side of the transfer chamber 800, the first group of process chambers 300 may be provided in a lower layer, and the second group of process chambers 300 may be provided in an upper layer. The first group of process chambers 300 may be distinguished from the second group of process chambers 300 depending on the types of chemicals used and the types of cleaning methods.

The index module 100 may include a first load port 100-1 and a second load port 100-2. The first load port 100-1 and the second load port 100-2 may be located to face each other with the transfer chamber 800 therebetween.

The process chambers 300 of the first process module 200-1 and the process chambers 300 of the second process module 200-2, which are disposed to face each other, may be provided at different heights. For example, the heights of substrate entrance/exit openings 301 of the process chambers 300 disposed in the first process module 200-1 may differ from the heights of substrate entrance/exit openings 301 of the process chambers 300 disposed in the second process module 200-2. In other words, the heights of upper ends of the process chambers 300 disposed in the first process module 200-1 may differ from the heights of upper ends of the process chambers 300 disposed in the second process module 200-2. A height difference "t" between the process chambers 300 of the first process module 200-1 and the process chambers 300 of the second process module 200-2 may correspond to a height difference between adjacent hands among a plurality of hands.

The transfer robot 900 is provided in the transfer chamber 800 so as to be movable. The transfer robot 900 serves to transfer substrates between the index module 100 and the process module 200.

Figure 5:
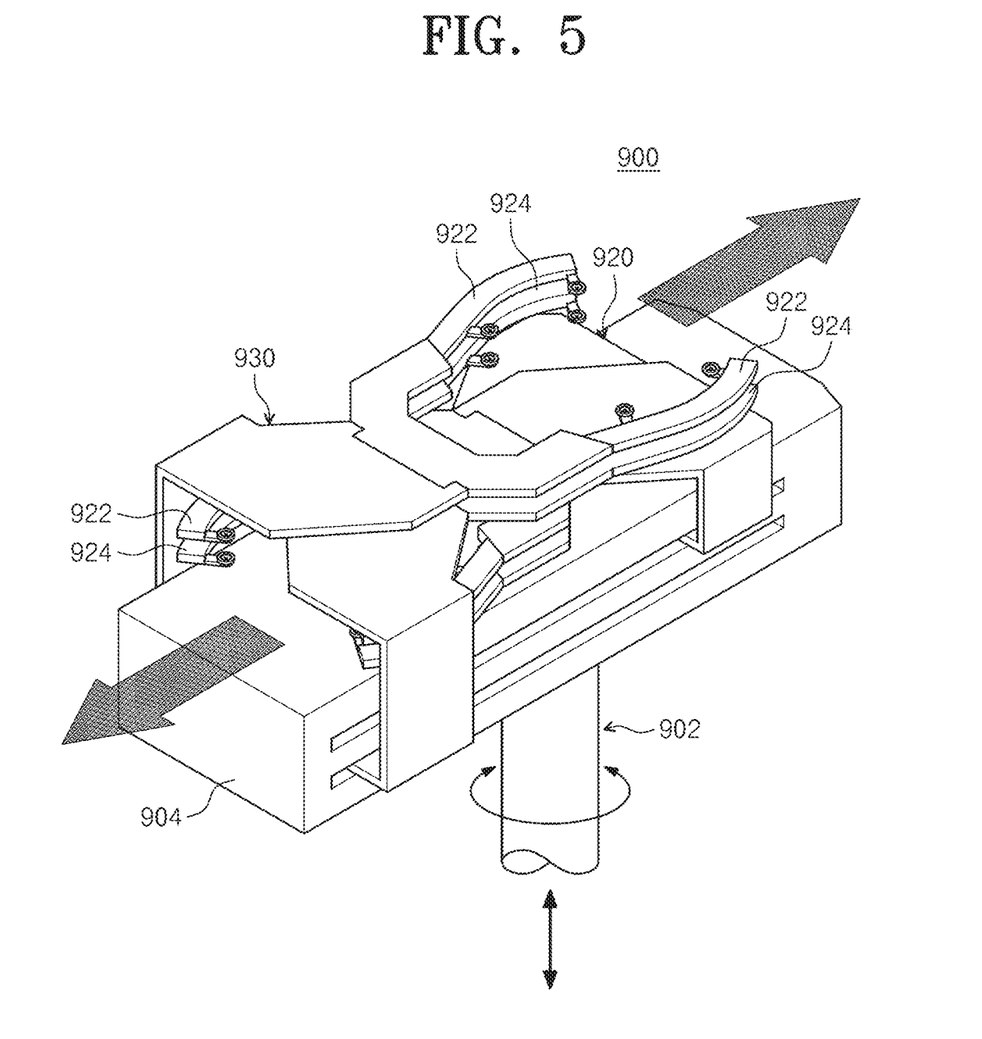
FIG. 5 is a perspective view illustrating a transfer robot in the apparatus of FIG. 3.
Figure 6:
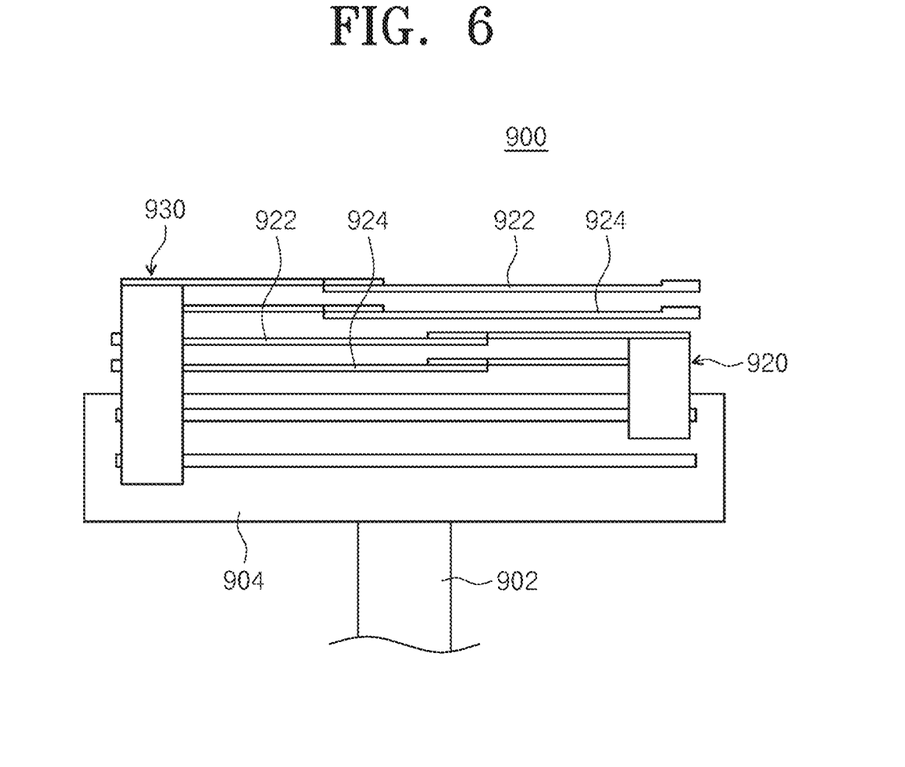
FIG. 6 is a side view of the transfer robot illustrated in FIG. 5.

FIG. 5 is a perspective view illustrating the transfer robot in the apparatus of FIG. 3, and FIG. 6 is a side view of the transfer robot illustrated in FIG. 5.

Referring to FIGS. 5 and 6, the transfer robot 900 may include a main body 902, a base 904, and a plurality of hands 910.

The base 904 may be provided on the main body 902 so as to be rotatable and height-adjustable.

The plurality of hands 910 may include a first hand 920 and a second hand 930. The first hand 920 and the second hand 930 may be disposed at different heights on the base 904. A height difference between the first hand 920 and the second hand 930 corresponds to the height difference "t" between the process chambers 300 of the first process module 200-1 and the process chambers 300 of the second process module 200-2.

The first hand 920 may transfer substrates into or out of the process chambers 300 of the first process module 200-1, and the second hand 930 may transfer substrates into or out of the process chambers 300 of the process module 200-2 at the same time as the first hand 920.

Furthermore, the first hand 920 and the second hand 930 may operate to simultaneously transfer substrates into or out of substrate carriers seated on the first load port 100-1 and the second load port 100-2. That is, the first hand 920 and the second hand 930 may extract substrates from the substrate carriers seated on the first load port 100-1 and the second load port 100-2, or may place substrates in the substrate carriers seated on the first load port 100-1 and the second load port 100-2.

For example, each of the first hand 920 and the second hand 930 may include two transfer hands 922 and 924 for replacement of substrates. For example, one of the two transfer hands 922 and 924 extracts a completely processed substrate from the process chamber 300, and the other places a non-processed substrate in the process chamber 300. In this embodiment, the first hand 920 and the second hand 930 are illustrated as having the two transfer hands 922 and 924. However, the first hand 920 and the second hand 930 are not limited thereto.

The first hand 922 and the second hand 924 may be independently moved forward and backward in the same direction at different heights. In this embodiment, the first hand 911 may be located over the second hand 924. Each of the first and second hands 922 and 924 includes a pocket part on which a substrate is placed, and the pocket part has the shape of "⊂". The shape of the pocket part is not limited to the shape of "⊂" and may be changed into various shapes.

The transfer robot 900 performs a substrate pickup operation in a state (a pickup position) in which the first transfer hand 922 or the second transfer hand 924 is moved forward. The transfer robot 900 performs a substrate transfer operation in a state (a home position) in which the first transfer hand 922 or the second transfer hand 924 is moved backward.

As described above, the transfer robot 900 includes the bidirectional hands, thereby minimizing a bottleneck phenomenon.

Figure 7:
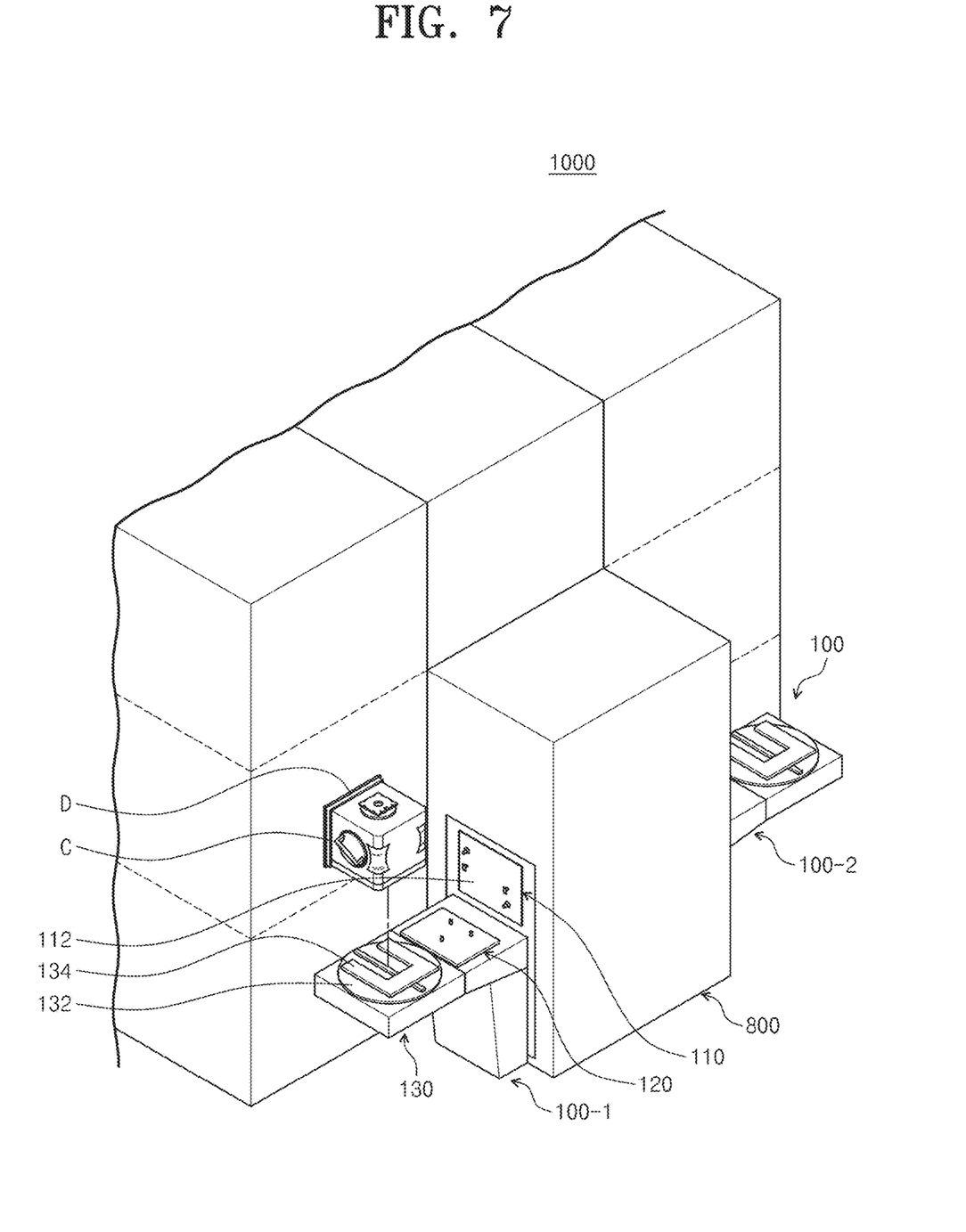
FIG. 7 is a view illustrating load ports in the apparatus of FIG. 2.
Figure 8:
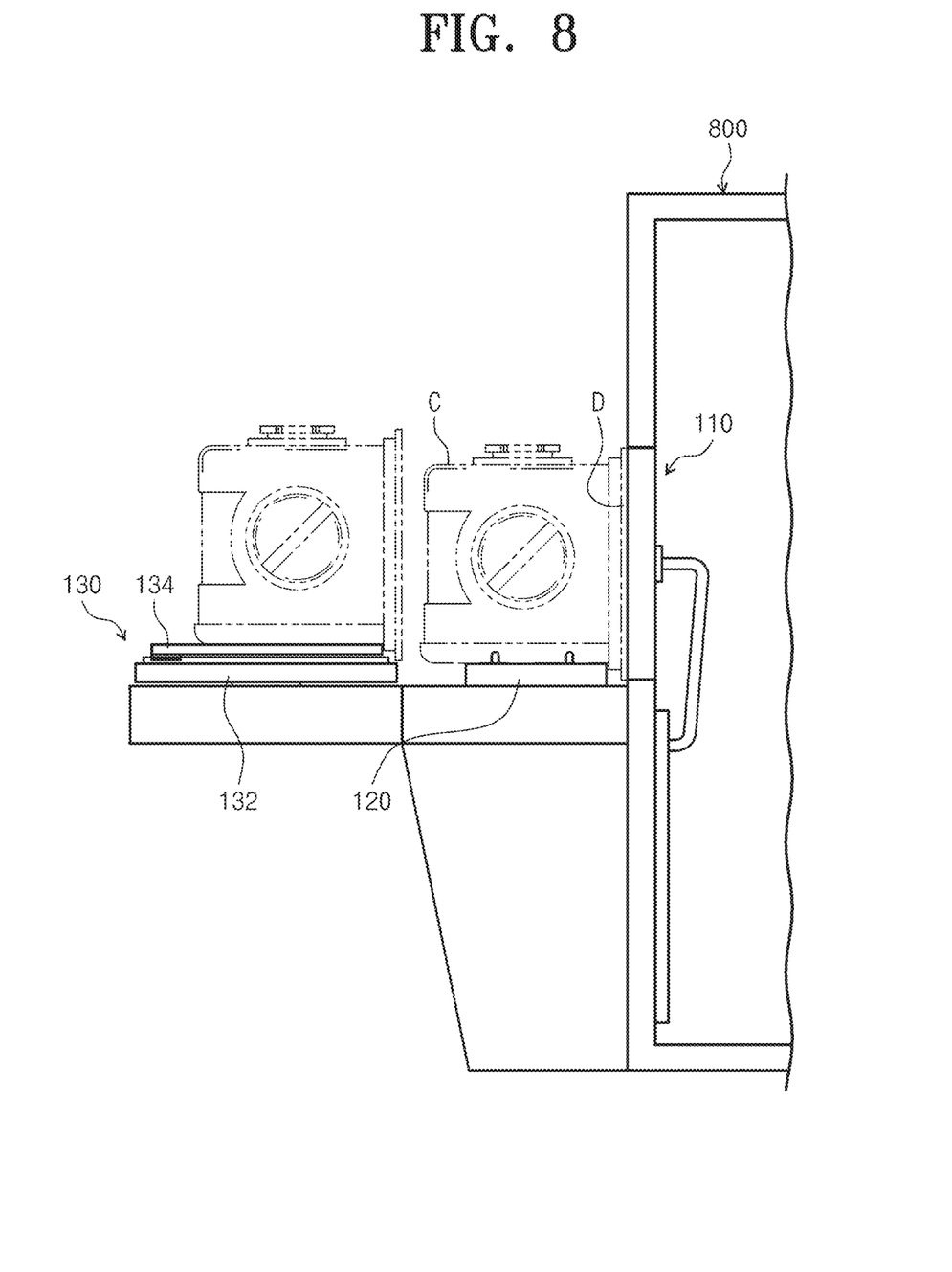
FIG. 8 is a side view illustrating a load port illustrated in FIG. 7.

FIG. 7 is a view illustrating the load ports in the apparatus of FIG. 2, and FIG. 8 is a side view illustrating the load port illustrated in FIG. 7.

Referring to FIGS. 7 and 8, in this embodiment, the first load port 100-1 and the second load port 100-2 have the same configuration. Therefore, a configuration of the first load port 100-1 will hereinafter be described in detail, and description of a configuration of the second load port 100-2 will be omitted.

The first load port 100-1 may include a vertical frame 110 that is placed in a vertical position and that includes a port door 112 for opening or closing a door D of a carrier C, a mounting table 120 formed in a structure in which the carrier C is seated on an upper surface, and a moving member 130 that moves the carrier C to the mounting table 120 from a first position in which the carrier C is transferred from a carrier transfer device. The mounting table 120 is mounted in a structure capable of moving in a direction toward or away from the port door 112.

Here, the carrier C includes a body that is open at one side and is selectively opened or closed by the door D and that has a plurality of slots therein in which substrates are loaded. For example, a front opening unified pod (FOUP) may be used as the carrier C. The door D is inserted into the open side of the carrier C to seal the interior of the carrier C from the outside and has a plurality of recesses that are coupled with the port door 112 of the first load port 100-1.

The vertical frame 110 is installed such that at least part thereof is attached to the transfer chamber 800. The vertical frame 110 is installed in an upright position to constitute part of a side of the transfer chamber 800. The port door 112, which can be opened or closed, is formed in the vertical frame 110 to allow a substrate to be transferred into the transfer chamber 800.

While being brought into close contact with the door D installed at the one side of the carrier C, the port door 12 may operate between a state of opening the door D and a state of isolating the interior space of the transfer chamber 800 and the interior space of the carrier C. The operation of the port door 112 may be performed by a motor and gears in the vertical frame 110. Alternatively, the port door 112 may be driven by a pneumatic cylinder or a hydraulic cylinder. Because the interior of the transfer chamber 800 is maintained as a clean room, the port door 112 is preferably completely isolated from the outside for cleanness of the transfer chamber 800.

The moving member 130 may include a moving table 132 that is able to rotate and slide to allow the door D of the carrier C to face toward the port door 112 of the first load port 100-1. The moving table 132 may be provided so as to be rotatable and may have, on an upper surface thereof, a carrier moving device 134 for placing the carrier C on the mounting table 120 or moving the carrier C placed on the mounting table 120 to the moving table 132. The carrier moving device 134 may be provided in various forms without being limited to the structure illustrated in the drawing. The moving table 132 may be located under a path along which a carrier transfer device (e.g., an overhead hoist transport (OHT)) moves.

FIGS. 9 to 12 are views illustrating steps of a process of loading the carrier onto the load port.

Figure 9:
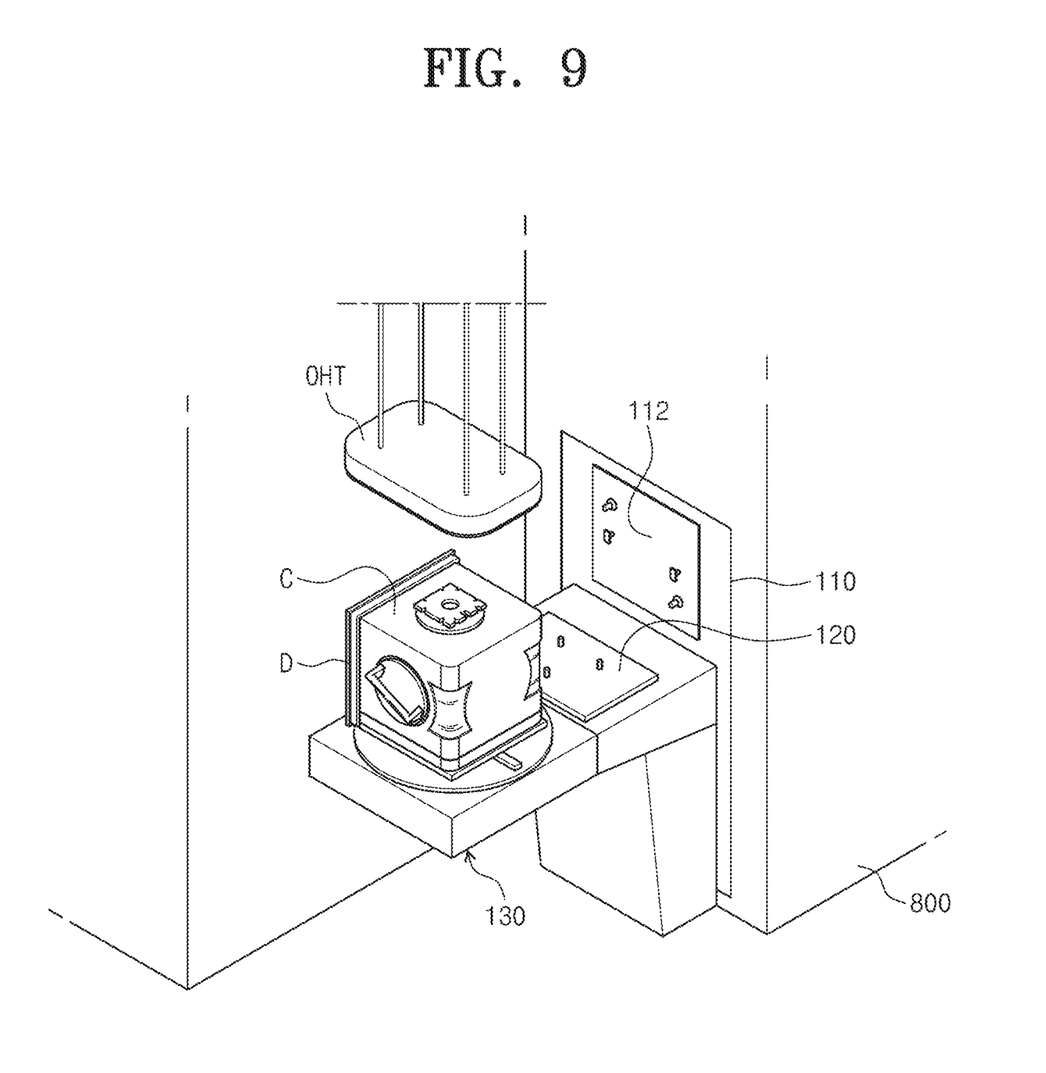
FIGS. 9 to 12 are views illustrating steps of a process of loading a carrier onto the load port.
Figure 10:
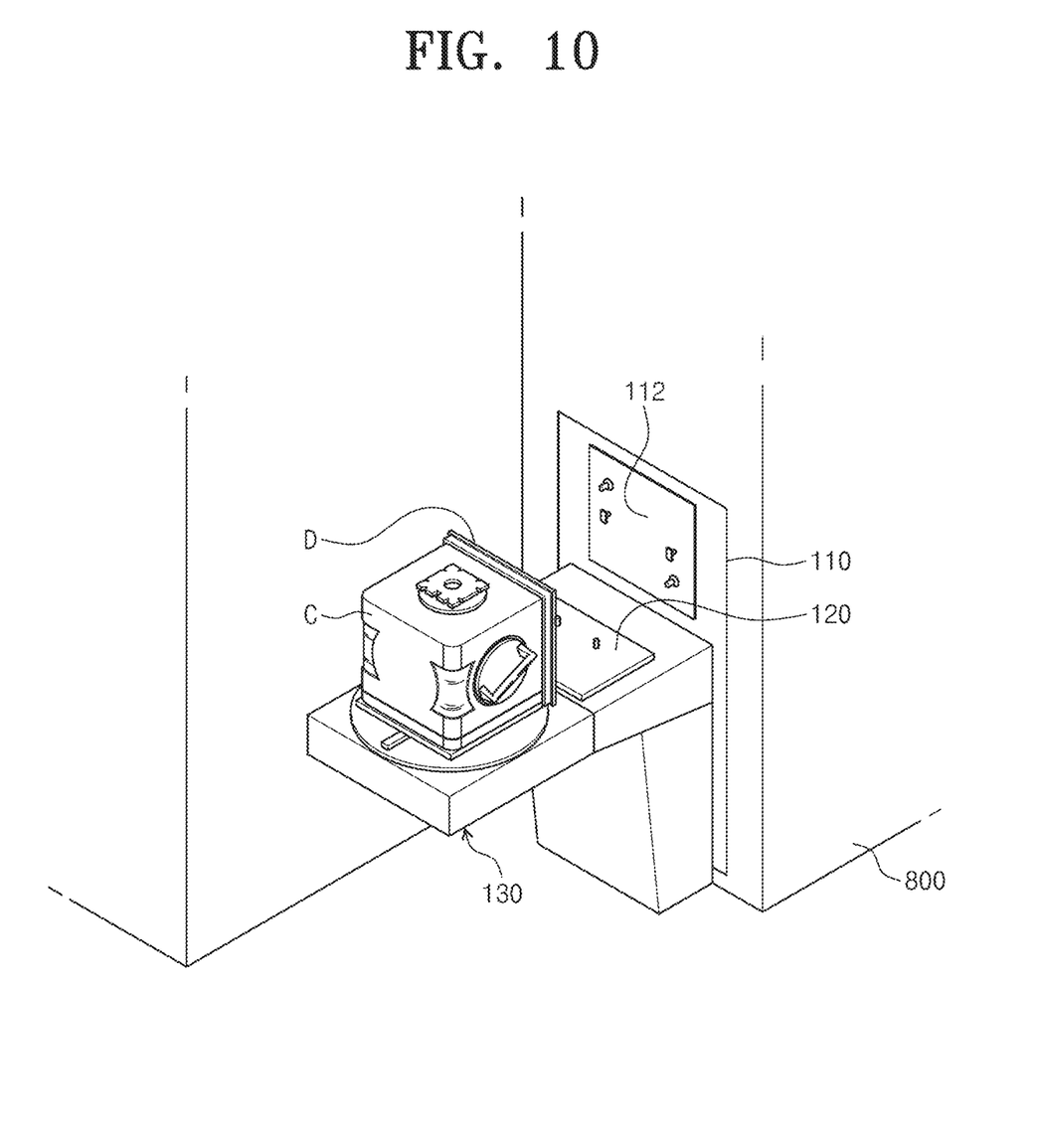
Figure 11:
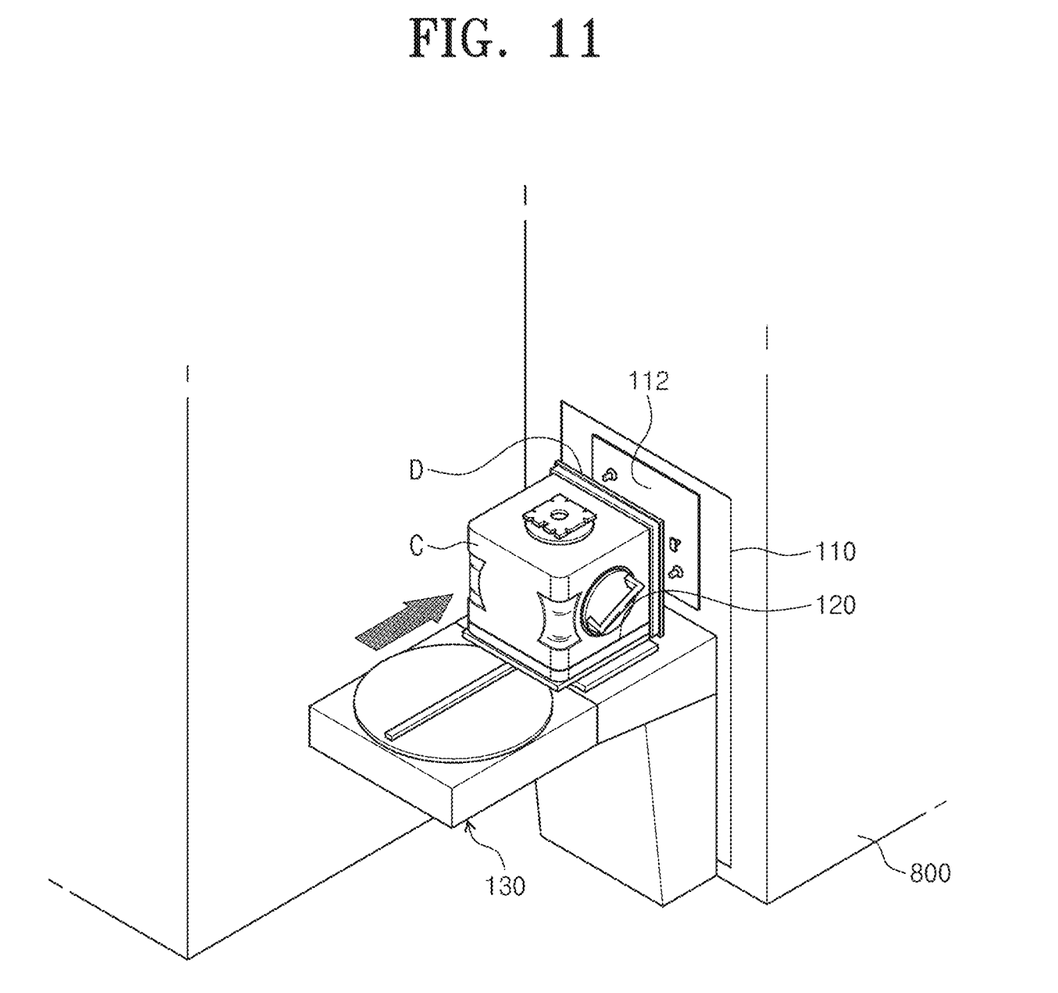
Figure 12:
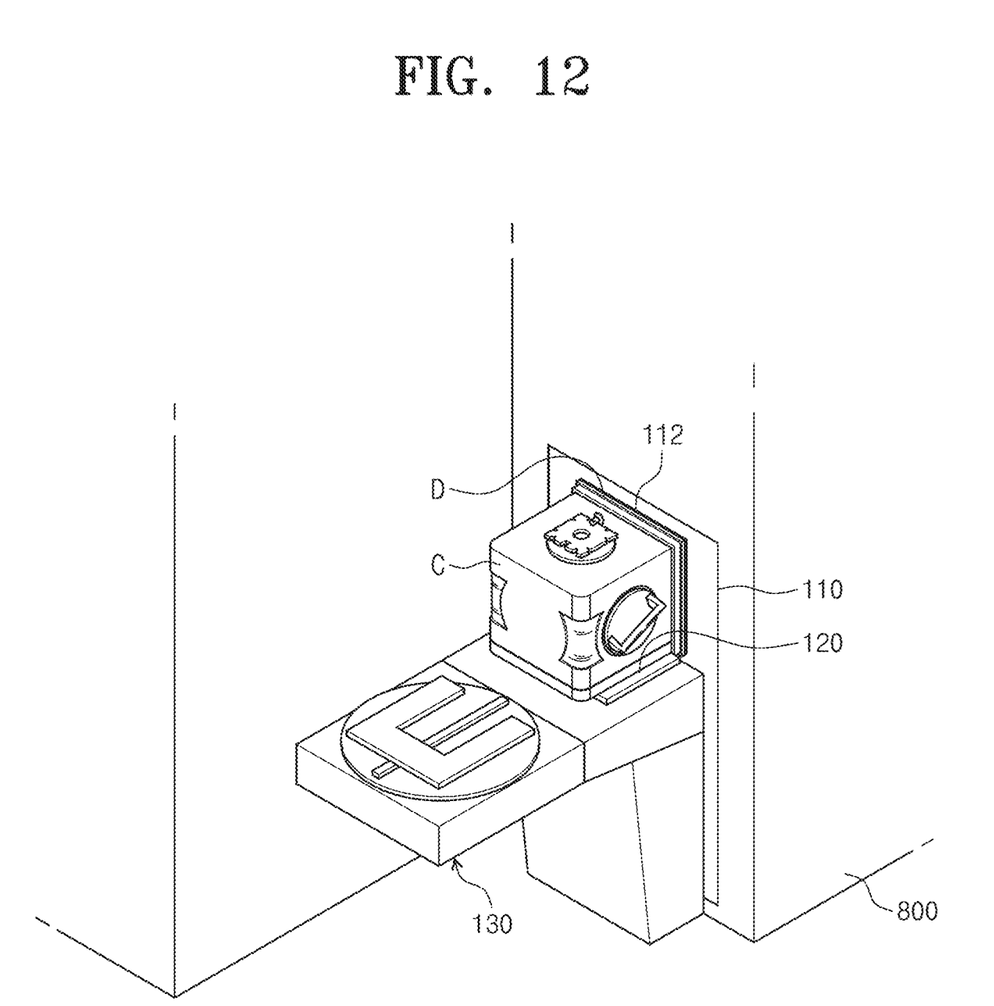

As illustrated in FIGS. 9 to 12, the carrier C is seated on the moving table 132 by the carrier transfer device (e.g., an overhead hoist transport (OHT)) (refer to FIG. 9). At this time, the carrier C is seated on the moving table 132 in the state in which the door D of the carrier C faces toward the process module 200. The moving table 132 rotates 90 degrees such that the door D of the carrier C faces toward the port door 112 (refer to FIG. 10). In this state, the carrier C is moved to the mounting table 120 by the carrier moving device 134 (refer to FIG. 11). The door D of the carrier C placed on the mounting table 120 may be opened by the port door 112 (refer to FIG. 12).

As described above, through the optimization of the layout, the substrate treating apparatus of the inventive concept may decrease the number of transfer devices and may omit a buffer chamber, thereby increasing the number of chambers by a multiple of 1.5 at the same foot-print and thus improving productivity. In addition, the substrate treating apparatus of the inventive concept may eliminate a bottleneck phenomenon by using the transfer robot of a bidirectional multi-layer multi-hand type.

Figure 13:
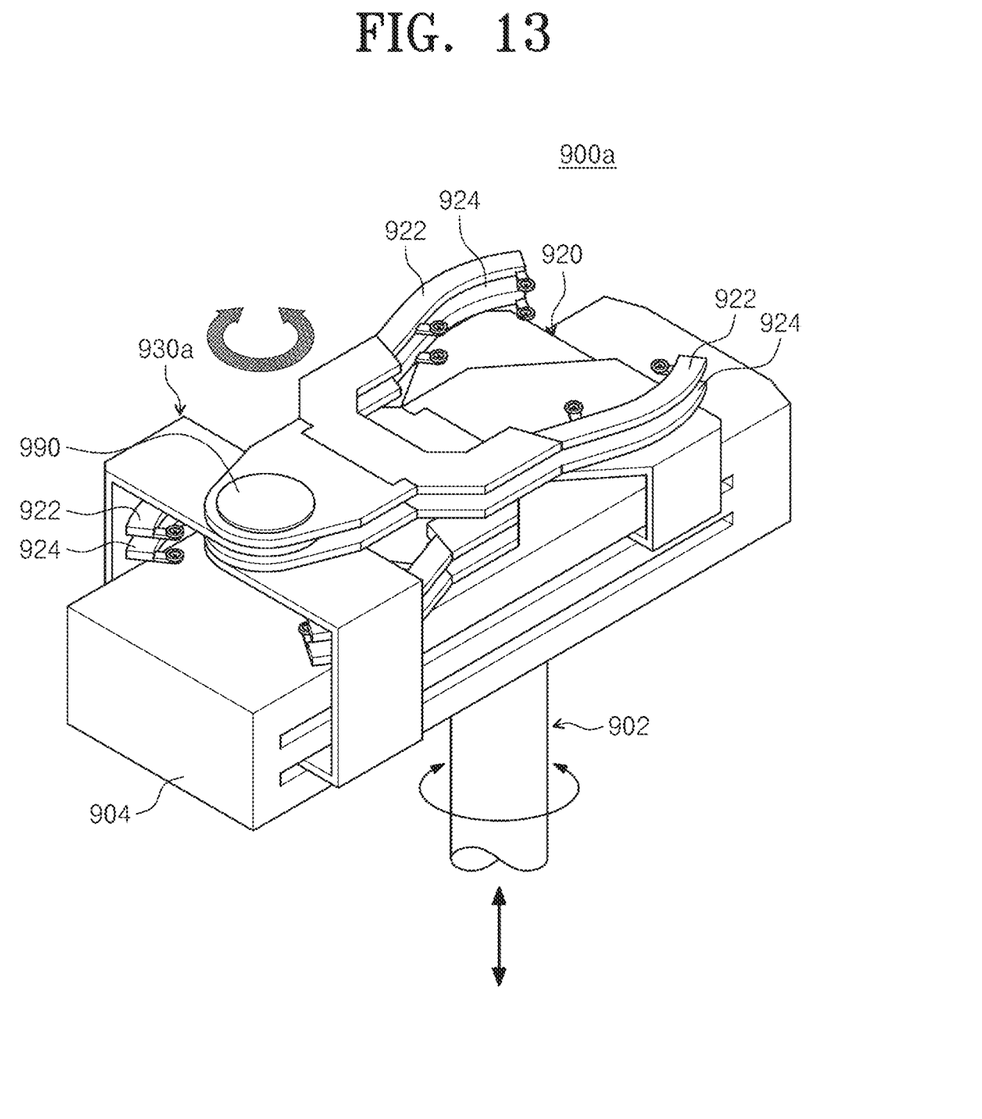
FIG. 13 is a view illustrating another embodiment of the transfer robot.

FIG. 13 is a view illustrating another embodiment of the transfer robot.

In describing the embodiment of FIG. 13, repetitive descriptions of components identical or corresponding to those in the above-described embodiment may be omitted.

A transfer robot 900a according to the embodiment of FIG. 13 differs from the transfer robot 900 according to the above-described embodiment in that a second hand 930a is able to change a direction so as to transfer a substrate in the same direction as the first hand 920.

That is, transfer hands 922 and 924 of the second hand 930a may be rotated by 180 degrees by a rotary part 990, and in the state of being rotated, the second hand 930a, together with the first hand 920, may transfer a substrate in the same direction.

According to the inventive concept, a remarkable effect of disposing more process chambers than in the related art without increasing the width of an apparatus may be obtained.

In addition, according to the inventive concept, by omitting an index robot and a buffer chamber in the same equipment area, more process chambers may be disposed, and thus an increase in production may be achieved.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising:
   a plurality of load ports configured to support substrate carriers;
   a plurality of process chambers configured to perform processes on substrates included in the substrate carriers; and
   a single transfer robot that is configured to transfer the substrates between the load ports and the process chambers,
   wherein the single transfer robot is configured to move along a transfer passage, the transfer passage having a lengthwise direction extending along a first direction,
   some of the load ports and the process chambers are arranged along the first direction on one side of the transfer passage and others of the load ports and the process chambers are arranged along an opposite side of the transfer passage,
   the single transfer robot is configured to transfer the substrates between the substrate carriers on the load ports to and from the process chambers,
   one of the load ports on the one side of the transfer passage is configured to support a first carrier having a first door, and
   one of the load ports on the other side of the transfer passage is configured to support a second carrier having a second door that faces the first door.

2. The substrate treating apparatus of claim 1, wherein a substrate entrance/exit opening of a first process chamber on the one side of the transfer passage among the process chambers and a substrate entrance/exit opening of a second process chamber on the opposite side of the transfer passage are at different heights.

3. The substrate treating apparatus of claim 1, wherein an upper end of a first process chamber on the one side of the transfer passage among the process chambers and an upper end of a second process chamber on the opposite side of the transfer passage are at different heights.

4. The substrate treating apparatus of claim 2, wherein the single transfer robot includes a plurality of hands at different heights, and
   the plurality of hands are configured to simultaneously transfer the substrates into or out of the first process chamber and the second process chamber.

5. The substrate treating apparatus of claim 4, wherein the plurality of hands are configured to rotate to face one direction so as to simultaneously transfer the substrates into or out of one process chamber or a carrier placed on one load port.

6. The substrate treating apparatus of claim 4, wherein a height difference between the substrate entrance/exit opening of the first process chamber and the substrate entrance/exit opening of the second process chamber or a height difference between an upper end of the first process chamber and an upper end of the second process chamber corresponds to a height difference between adjacent hands among the plurality of hands.

7. The substrate treating apparatus of claim 4, wherein the load ports face each other, with the transfer passage between the load ports that face each other.

8. The substrate treating apparatus of claim 1, wherein each of the load ports includes:
a vertical frame having a port door configured to open a door of a carrier or close the door of the carrier;
a mounting table configured to seat the carrier, wherein the mounting table is configured to move to a position in which the door of the carrier is opened by the port door or is closed by the port door; and
a moving member configured to move the carrier to the mounting table from a first position, the first position being a position in which the carrier is transferred from a carrier transfer device.

9. The substrate treating apparatus of claim 8, wherein the moving member includes a moving table configured to rotate and slide, the rotating and sliding such that the door of the carrier faces toward the port door of the load port.

10. The substrate treating apparatus of claim 9, wherein the moving table is under a path along which the carrier transfer device is configured to move.

11. A transfer robot for transferring substrates between carriers placed on load ports and process chambers, the transfer robot comprising:
a first hand; and
a second hand at a different height from the first hand,
wherein the first hand is configured to transfer the substrates into or out of one of a first process chamber and a second process chamber, the first chamber and the second chamber opposite to each other with respect to a transfer passage, and
the second hand is configured to transfer the substrates into or out of the other process chamber at the same time as the first hand, and
a height difference between the first hand and the second hand corresponds to a height difference between a substrate entrance/exit opening of the first process chamber and a substrate entrance/exit opening of the second process chamber.

12. The transfer robot of claim 11, wherein one of the first hand and the second hand is configured to rotate such that the first hand and the second hand face one direction to simultaneously transfer the substrates into or out of one of the first process chamber and the second process chamber.

13. The transfer robot of claim 11, wherein each of the first hand and the second hand includes a plurality of transfer hands.

14. A substrate treating apparatus comprising:
an index module including one or more load ports;
a process module including one or more process chambers configured to receive substrates from the index module and to perform processes on the substrates; and
a single transfer robot that is configured to transfer the substrates between the index module and the process module,
wherein the single transfer robot is movable along a transfer passage having a lengthwise direction extending along a first direction,
some of the load ports and the process chambers are arranged along the first direction on one side of the transfer passage and others of the load ports and the process chambers are arranged along an opposite side of the transfer passage,
the single transfer robot is configured to transfer the substrates between carriers on the load ports to and from the process chambers,
one of the load ports on the one side of the transfer passage is configured to support a first carrier having a first door, and
one of the load ports on the other side of the transfer passage is configured to support a second carrier having a second door that faces the first door.

15. The substrate treating apparatus of claim 14, wherein a substrate entrance/exit opening of a first process chamber on the one side of the transfer passage among the process chambers and a substrate entrance/exit opening of a second process chamber on the opposite side of the transfer passage are provided at different heights.

16. The substrate treating apparatus of claim 14, wherein an upper end of a first process chamber on the one side of the transfer passage among the process chambers and an upper end of a second process chamber on the opposite side of the transfer passage are at different heights.

17. The substrate treating apparatus of claim 15, wherein the single transfer robot includes a plurality of hands disposed at different heights, and
the plurality of hands simultaneously transfer the substrates into or out of the first process chamber and the second process chamber.

18. The substrate treating apparatus of claim 17, wherein the plurality of hands are configured to rotate to face one direction so as to simultaneously transfer the substrates into or out of one process chamber or a carrier placed on one load port.

19. The substrate treating apparatus of claim 17, wherein a height difference between the substrate entrance/exit opening of the first process chamber and the substrate entrance/exit opening of the second process chamber or a height difference between an upper end of the first process chamber and an upper end of the second process chamber corresponds to a height difference between adjacent hands among the plurality of hands.

20. The substrate treating apparatus of claim 1, wherein the single robot is configured to directly transfer the substrates between the substrate carriers on the load ports to and from the process chambers by picking up the substrates from the substrate carriers, directly moving linearly along the lengthwise direction, and loading the substrates into the process chambers, the picking up, the moving linearly, and the loading performed with the single robot.

* * * * *